United States Patent [19]
Shirasaki et al.

[11] Patent Number: 4,637,027
[45] Date of Patent: Jan. 13, 1987

[54] LASER LIGHT SOURCE DEVICE

[75] Inventors: Masataka Shirasaki; Hirochika Nakajima, both of Kawasaki; Yasuo Furukawa, Zama; Takefumi Inagaki, Kawasaki, all of Japan

[73] Assignee: Fujitsu Limited, Kawasaki, Japan

[21] Appl. No.: 654,628

[22] Filed: Sep. 26, 1984

[30] Foreign Application Priority Data

Sep. 26, 1983 [JP] Japan ................. 58-177233
Sep. 26, 1983 [JP] Japan ................. 58-177227

[51] Int. Cl.$^4$ ............................................. H01S 3/10
[52] U.S. Cl. ............................... 372/27; 372/9; 372/37; 372/23; 372/64; 372/97
[58] Field of Search ............. 372/27, 26, 97, 19, 372/9, 29, 37, 12, 28, 23, 14, 64

[56] References Cited
U.S. PATENT DOCUMENTS 3,356,438 12/1967 Macek et al. .................. 372/26
3,436,677 4/1969 Max et al. ..................... 372/27
3,639,855 2/1972 Dillon, Jr. et al. ............. 372/27
4,305,046 12/1981 Le Floch et al. ............... 372/27
4,496,518 1/1985 Marie ........................... 372/27

Primary Examiner—Leon Scott, Jr.
Attorney, Agent, or Firm—Armstrong, Nikaido, Marmelstein & Kubovcik

[57] ABSTRACT

Disclosed is a laser light source device having a laser and an external resonator, wherein as a base, a Faraday rotator is provided at the laser side front of a reflection plane of the resonator so that clockwise and counter-clockwise circular polarizations which have frequencies slightly different to each other are generated, and if a laser such as a semiconductor laser having an eigenmode having a linear polarization is applied, elements which rotate a polarization by 90 degrees by one emission-and-return through the element, for example, quarter-wave plates, are arranged, The device does not need a strong magnetic field or a strong electric field, and can easily generate lights which are a constant strength. Thus the device can be miniaturized and a high efficiency obtained.

10 Claims, 7 Drawing Figures

LASER LIGHT SOURCE DEVICE

BACKGROUND OF THE INVENTION (1) Field of the Invention

The present invention relates to a light frequency controller wherein two lights having a stabilized frequency difference are generated using a single frequency light source, more particularly, it relates to a light source device preferable for use when a heterodyne measurement is carried out using light.

(2) Description of the Prior Art

Recently, methods have been proposed for measuring various physical quantities by using a laser light. In a measuring method using the wavelength or frequency of the laser light as a reference, the frequency of the light is high, i.e., more than $10^{14}$ Hz, and thus a direct conversion to an electric signal is impossible. Usually, the light to be measured suffers from interference from another light having a slightly different frequency from the light to be measured, causing a beat signal to be generated. The heterodyne measurement method is performed by detecting the phase or the frequency of the beat signal. In this method the magnitude of the difference of the two frequencies must be within the range of approximately $10^7$ to $10^{10}$ Hz ($1/10^4$ to $1/10^8$ of the frequency of the light to be measured), in which range processing by an electrical circuit becomes possible, the frequencies of the two lights, respectively, are stable and the frequency difference between them is also stable.

In practice, the two lights having the above-mentioned difference of frequencies cannot be obtained from two independent laser light sources, because of their frequency stability. Therefore, when using a single laser light source, the methods of generating two lights having a constant difference of frequencies, for example, by utilizing the Zeeman effect or by utilizing a diffraction effect due to ultrasonic waves, are proposed. However, in the method utilizing the Zeeman effect, a large magnet is required to obtain a desired difference of frequencies, and since the two lights having the difference of frequencies are obtained by the separation of clockwise circular polarization light from counter-clockwise circular polarization light, this method cannot be applied to a semiconductor laser which generates a linear polarization light (one of two linear polarization lights, i.e., transverse electric (TE) wave and transverse magnetic (TM) wave).

In the method utilizing the diffraction effect due to ultrasonic waves, the ultrasonic wave modulator requires a very strong driving power to obtain a desirable difference of frequencies through a change in the Bragg reflecting condition obtained with ultrasonic waves, and countermeasures are required against the heat generated.

On the other hand, as shown in FIG. 1, a method is proposed in which a light I (frequency $\omega$) from one light source is separated into two lights, and the respective lights are modulated by external signals (frequency $\Delta\omega$) having a phase deviated by $\frac{1}{4}$ period using photoelectric elements $1a$ and $1b$. The two lights Ia and Ib obtained by the above-mentioned procedure, which include the frequencies $\omega+\Delta\omega$ and $\omega-\Delta\omega$, are further separated into two lights. After an appropriate light path difference between the separated lights Ia and Ib is obtained, the two lights are then combined, and a further two lights Oa (frequency $\omega+\Delta\omega$) and Ob (frequency $\omega-\Delta\omega$) are taken out separately.

Using the above method, the two lights having a desirable difference of frequencies can be obtained by a comparatively small external signal (electric or magnetic signal). Also, the two lights having the difference of frequencies are obtained without a magnetic field, a semiconductor laser can be used as a light source, and the problems in the conventional method are effectively solved. On the other hand, when the light having the original frequency is modulated, the intensity thereof is effected by amplitude modulation. As a result, the modulated light is superimposed on the beat signal, and subsequently, separation of the superimposed light becomes difficult. The above problems in the conventional methods give rise to disadvantages in that the field of application of these methods is limited.

SUMMARY OF THE INVENTION

The object of the present invention is to provide a laser light source device capable of generating, from a single light source, two lights each having different frequencies, wherein a strong magnetic field or electric field is not necessary, a semiconductor laser can be used as a light source if required, lights having a constant intensity can be easily generated, the dimension of the device is small, the performance of the device is high, and whereby the heterodyne measurement of light can be used over a wider range of applications.

According to the fundamental feature of the present invention, there is provided a laser light source device having a laser and an external resonator, comprising a Faraday rotator at the laser side front of one of the reflection planes included in the external resonator, a clockwise circular polarization and a counter-clockwise circular polarization each having a different frequency being generated by applying the laser light through the Faraday rotator under a magnetic field.

According to another aspect of the present invention there is provided a laser light source device wherein, when a laser is provided with a resonator in which the eigen-mode is two linear polarizations having oscillational directions crossing each other perpendicularly, elements through which light is emitted and returned in such a manner that the polarization plane is rotated by 90 degrees, are arranged one by one at the laser side front of another reflection plane of the resonator and at the laser side front of the Faraday rotator.

According to still another aspect of the present invention, there is provided a laser light source device wherein, when a semiconductor laser is used as a laser light source, the semiconductor laser is provided with an external resonator and elements through which light is emitted and returned in such a manner that the polarization plane is rotated by 90 degrees, are arranged at an angle of 45 degrees between the axis of the elements and the plane of the active layer in the semiconductor laser.

DESCRIPTION OF THE PREFERRED EMBODIMENTS

An embodiment of the present invention will now be explained with reference to the drawings.

Figure 1:
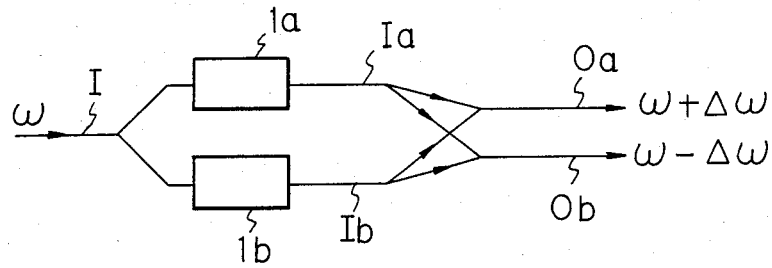
FIG. 1 shows a schematic diagram of an example of a conventional light source device for generating, from a single light source, two lights having different frequencies.
Figure 2:
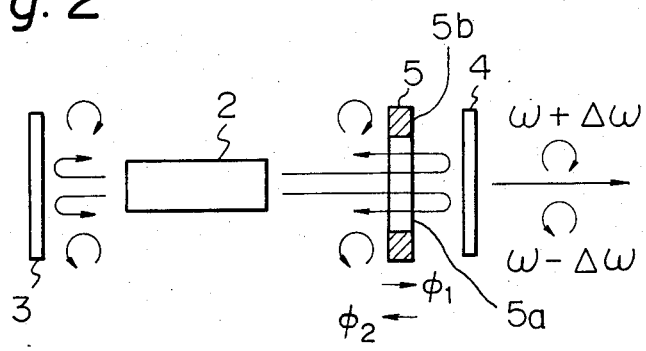
FIG. 2 shows a schematic diagram explaining a fundamental principle of the present invention.

FIG. 2 is a diagram explaining an operational principle of portions of the fundamental constitution. A laser 2 has an external resonator including reflection planes (reflection mirrors) 3 and 4, and a Faraday rotator 5 is provided at the laser 2 side front of one of the reflection planes (reflection plane 4 in the figure).

In the oscillational light of a gas laser and the like, two kinds of polarization modes exist in a degenerate state. In the above constitution, clockwise and counter-clockwise circular polarization are adopted and these are made to resonate through the Faraday rotator 5. The Faraday rotator 5 has a different refractive index for the clockwise and counter-clockwise circular polarization, respectively, under a magnetic fields. Since the relationship between the refractive index (n) of a medium and light velocity (v) through the medium is nv=constant, when the clockwise circular polarization and the counter-clockwise circular polarization pass through the Faraday rotator 5 having a predetermined thickness, a difference occurs in the time of the passage of the two polarizations. As a result, the apparent distance between the reflection planes 3 and 4 for the respective polarizations becomes different. Namely, the oscillation frequencies in the clockwise and the counter-clockwise polarizations is different. In the above relationship, if the Faraday rotator 5 is not provided, or if the Faraday rotator 5 is provided but a magnetic field is not applied, the clockwise and the counter-clockwise circular polarizations are in a time reversal relationship with each other. Namely, at that frequency, they are in a degenerate state. At this time, the magnetic field is applied and the degenerate state is released, and one frequency becomes two frequencies.

As mentioned above, the lights each having different frequencies $\omega + \Delta\omega$ and $\omega - \Delta\omega$ are output through the reflection plane 4. In the above example, since the two lights passing through the reflection plane 4 are circular polarizations, the polarizations can be separated and be taken out by passing them through a quarter-wave plate and a polarization separating element not shown). By the same processing, the above two lights can be taken out from the reflection plane 3.

The use of the above-mentioned laser is not limited to the gas laser, any arbitrary laser including lights having a circular polarization mode as an oscillatory light can also be used.

Figure 3:
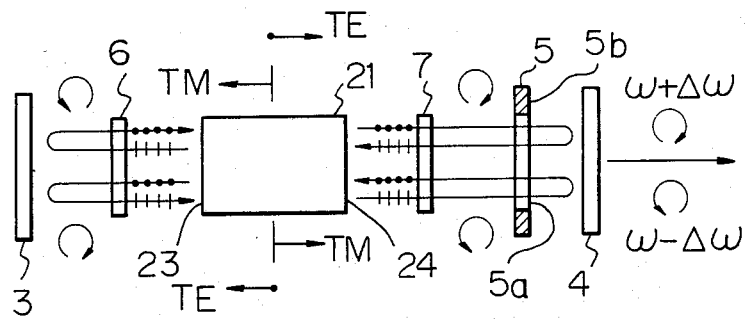
FIG. 3 is a diagram showing a constitution of a laser light source device using a semiconductor laser according to an embodiment of the present invention.

On the other hand, when a laser which generates linear polarizations having oscillational directions crossing each other perpendicularly is used, as shown in FIG. 3, quarter-wave plates 6 and 7, as elements through which light is emitted and returned in such a manner that the polarization plane is rotated by 90 degrees, are provided one by one at the laser side fronts of the reflection plane 3 and the Faraday rotator 5. Below, an example of the device shown in FIG. 3 using a semiconductor laser is explained.

Figure 4:
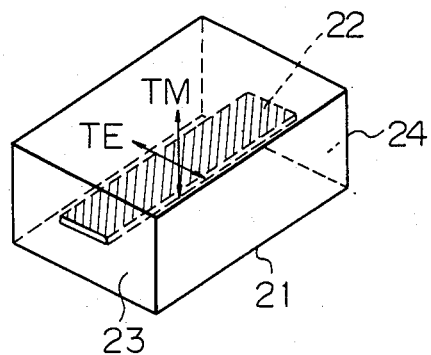
FIG. 4 is a perspective view explaining the semiconductor laser in the device of FIG. 3.

In the usual semiconductor laser, two linear polarizations crossing each other perpendicularly are called the TE-wave and the TM-wave, and are an eigen-mode of the resonator. In a semiconductor laser 21 as shown in FIG. 4, the polarization plane of the TE-wave is in parallel with and the TM-wave is perpendicular to an active layer 22 plane (hatched plane) which is the light emitting and waveguide domain. The following is an explanation of the case wherein the above-mentioned TE-wave and TM-wave are irradiated from the end planes 23 and 24 of the semiconductor laser 21 and pass through the quarter-wave plates 6 and 7.

In FIG. 3, the TM-wave irradiated from the end plane 23 of the semiconductor laser 21 is given a circular polarization by the quarter-wave plate 6. This circular polarization is reflected by the reflection plane 3, and then is passed back through the quarter-wave plate 6, to again become a linear polarization. At this time, since the polarization plane is rotated by $\pi/2$, the wave was a TE-wave. Further, the light is irradiated from the end plane 24 and passes through the quarter-wave plate 7, and is then again given a circular polarization. This circular polarization is reflected by the reflection plane 4, is passed back through the quarter-wave plate 7, and is then returned as the TM-wave by the rotation of the polarization plane by $\pi/2$.

Meanwhile, the TE-wave irradiated from the end plane 23 of the semiconductor laser 21 is given a circular polarization in a reverse direction to that of the above case through the quarter-wave plate 6, and after the TE-wave is reflected by the reflection plane 3, the TE-wave is converted to the TM-wave through the quarter-wave plate 6. Further, the wave is irradiated from the end plane 24, is given a circular polarization in the reverse direction through the quarter-wave plate 7, is reflected by the reflection plane 4, and is then passed through the quarter-wave plate 7 and returned as the TE-wave.

The decision of whether the clockwise or the counter-clockwise circular polarization is given to the respective TE-wave and TM-wave is determined by the positive or negative sign of the angle of ±45 degree which is formed by the axis of the quarter-wave plate and the active layer plane.

As mentioned above, when the Faraday rotator is not provided, or the Faraday rotator is provided but the magnetic field is not applied, the oscillation light of the semiconductor laser 21 resonates in the degenerate state of the TE-wave and TM-wave between the reflection planes 3 and 4. However, even when the quarter-wave plates 6 and 7 are provided at both sides of the semiconductor laser 21, it is impossible to distinguish between the TE-mode and TM-mode.

However, in the lights passing through the Faraday rotator 5, two states having different modes, i.e., clockwise circular polarization and counter-clockwise circular polarization, exist. As mentioned above, since the Faraday rotator 5 has different refractive indexes for the clockwise and the counter-clockwise circular polarization, respectively, the effective distances between the reflection planes 3 and 4 for the two lights having two states are different. Therefore, these lights have different resonant frequencies.

As mentioned above, if the Faraday rotator is not provided, or the Faraday rotator is provided but the magnetic field is not applied thereto, these two modes are in the state of time reversal. Therefore, if the magnetic field is applied and the degeneracy is released, when the frequency of the clockwise circular polarization is given by $\omega+\Delta\omega$, the frequency of the counter-clockwise circular polarization is given by $\omega-\Delta\omega$.

In the above processing, for example, since the two lights having frequencies of $\omega+\Delta\omega$ and $\omega-\Delta\omega$ as clockwise and counter-clockwise circular polarization are emitted from the reflection plane 4, these two lights can be taken out separately by using the quarter-wave plate and polarization separating element as mentioned previously. Namely, in the above constitution, the semiconductor laser can be used as a light source in a manner equivalent to that of a gas laser. Although this semiconductor laser does not need a reflection coating at the end planes 23 and 24, as do the usual semiconductor lasers, it is better to apply the coating to prevent reflection.

The Faraday rotator 5, for example, comprises a magnetic thin plate 5a made of yttrium-iron-garnet (YIG), performs with the characteristic Faraday effect, and is light transmissible, and a ring magnet 5b for magnetizing the magnetic thin plate 5a along the light transmitting direction $\phi_1$ or $\phi_2$. The magnetic thin plate 5a is mounted in the ring of the ring magnet 5b.

According to the above described embodiment, since the magnetic field to be applied to the Faraday rotator to obtain a required frequency difference ($\Delta\omega$) can be comparatively weak, the construction of the light source device can be made smaller and the control for the frequency difference made easier. In addition, the advantage is gained of obtaining two lights having a constant intensity. Where the frequency difference $\Delta\omega$ is fixed to a certain value, a permanent magnet can be used to supply the magnetic field. If an alternating magnetic field is applied, the frequency difference $\Delta\omega$ can be modulated.

Figure 5:
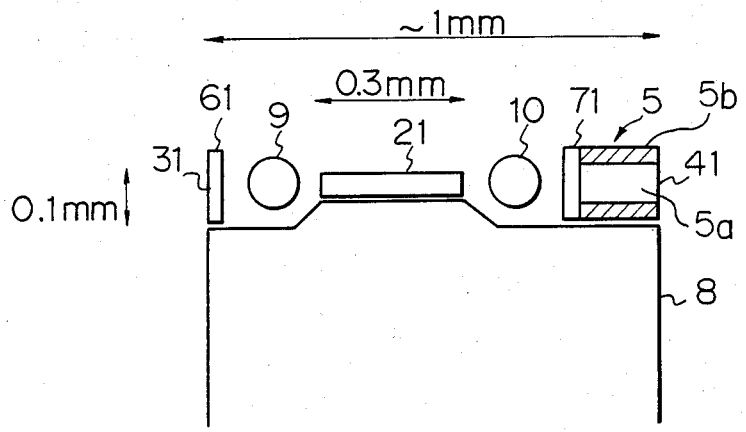
FIG. 5 is a schematic diagram showing an example of a practical constitution of the laser light source device of FIG. 3.

FIG. 5 shows an example of a practical constitution of a laser light source device according to the embodiment of the present invention. In the figure, a semiconductor laser is used as a light source. The semiconductor laser 21 is put on a heat sink 8, and, for example, spherical condenser lenses 9 and 10 are provided at both the light output ends of the semiconductor laser 21. Quarter-wave plates 61 and 71 are provided at both sides of the spherical lenses 9 and 10, respectively. One side of the quarter-wave plate 61 is coated with a reflection coating 31 having, for example, a reflectivity of 99 percent, and the Faraday rotator 5 is provided adjacent to one side of the quarter-wave plate 71. One side of the Faraday rotator 5 is coated with a reflection coating 41 having, for example, a reflectivity of 90 percent.

The distance between the reflection coatings 31 and 41 is approximately 1 mm, the length between the end planes of the semiconductor laser 21 is approximately 0.3 mm, and the diameter of the spherical lenses 9 and 10 is approximately 0.2 mm. Thus the device is miniaturized and the two-frequencies-supplying laser light source device is obtained. The quarter-wave plate is usually made of a quartz plate having double refraction characteristics.

Each element (2, 3, 4, 5, 6, 7) shown in FIGS. 2 and 3, is practically arranged on stems (not shown) made of non-magnetic metal, e.g., a stainless steel, using a holder for fixing, and a cap (not shown) made of non-magnetic metal is attached to the stems to cover the elements, thus completing the casing of the elements.

Figure 6:
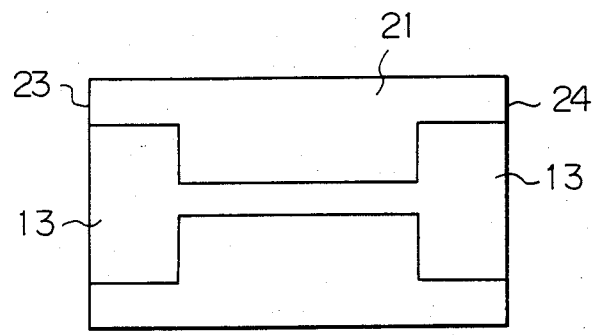
FIGS. 6 and 7 show plan views of the constitutions of the laser diodes used as modifications in the embodiment of the present invention.
Figure 7:
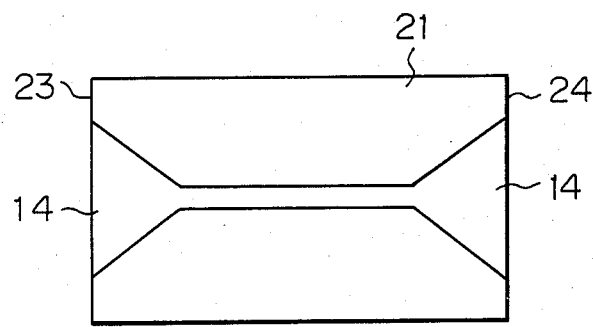

FIGS. 6 and 7 show modifications of the present embodiment. In the modifications, the sectional area of the waveguide layer provided adjacent to the active layer of the semiconductor laser 21 is enlarged near the end planes 23 and 24 of the semiconductor laser 21 for receiving and sending the light. These areas are shown as reference numerals 13 and 14 in the plan views of FIG. 6 and FIG. 7, respectively. These modifications prevent the reflection of the laser light at the end planes, and thus an external resonator type semiconductor laser light source device, wherein the complex mode rarely occurs and stable oscillation is performed, is obtained.

As another example of the modification of the present invention, the quarter-wave plates 6 and 7 used as the elements in the device of FIG. 3 can be replaced by a 45 degree Faraday rotator made of yttrium-iron-garnet (YIG), through which the polarization plane is rotated by 90 degrees for each light emission and return. Since the quarter-wave plate has double refraction characteristics, integration of the device is difficult. However, if the Faraday rotator is used instead of the quarter-wave plate, integration of the device can be accomplished.

As yet another example of the modifications, the sectional form of the waveguide layer of the semiconductor laser may have anisotropic characteristics. Namely, if the refractive index of the TE-wave is made to be different from that of the TM-wave, the interaction of the two waves becomes weaker, and thus a stable oscillation can be obtained.

The Faraday rotator 5 having a polarization angle regarding the frequency $\Delta\omega$ in the present embodiment, for example, can be made of a paramagnetic glass.

According to the device of the present embodiment, the method of heterodyne measurement on light can be applied over a wide field. For example, if a magnetic field to be measured is applied to the Faraday rotator 5, the device operates as a light frequency modulator, and by utilizing the modulated data, a heterodyne type magnetic field measuring device is obtained.

We claim:

1. A laser light source device comprising:
   a laser having a first end plane and a second end plane, and an external resonator including first and second reflection planes spaced, respectively, from said first and second end planes;
   a Faraday rotator positioned between said first end plane and said first reflection plane; and
   means associated with said Faraday rotator for producing a magnetic field therein, said magnetic field causing an effect such that light of clockwise circular polarization and light of counter-clockwise circular polarization will be differently affected upon passage through said Faraday rotator, thereby producing from said laser light source device two light outputs, one of each polarization and having different oscillation frequencies determined by the strength of said magnetic field applied to said Faraday rotator.

2. A laser light source device as set forth in claim 1, wherein said Faraday rotator is a 45 degree Faraday rotator.

3. A laser light source device as set forth in claim 2, wherein said 45 degree Faraday rotator is made of yttrium-iron-garnet.

4. A laser light source device as set forth in claim 1, wherein said Faraday rotator is made of a paramagnetic glass.

5. A laser light source device as set forth in claim 1, wherein the eigen-mode of said laser is linear polarizations crossing each other perpendicularly in the oscillating direction thereof, and said laser device further comprises a pair of elements for rotating a polarization by 90 degrees by one emission-and-return through an element, said elements being arranged with a first element positioned between said first end plane and said Faraday rotator and a second element positioned between said second end plane and said second reflection plane.

6. A laser light source device as set forth in claim 5, wherein each said element is a quarter-wave plate.

7. A laser light source device as set forth in claim 1, wherein said quarter-wave plate is made of a quartz plate.

8. A laser light source device as set forth in claim 5 wherein said laser is a semiconductor laser including a waveguide, and wherein the sectional area of a waveguide layer adjoined to an active layer of the semiconductor laser is enlarged near the end planes through which the laser light enters and is emitted.

9. A laser light source device as set forth in claim 5 wherein said laser is a semiconductor laser including a waveguide, and wherein a waveguide layer adjoined to an active layer of the semiconductor laser has anisotropic characteristics due to the sectional form thereof so that the refractive index of the transverse electric wave is different from that of the transverse magnetic wave.

10. A laser light source device as set forth in claim 1 or 5, wherein said means for producing a magnetic field produces a magnetic field of variable intensity, and the frequency difference between the different oscillation frequencies of said two light outputs varies in accordance with the intensity of said magnetic field.

* * * * *